(12) United States Patent
Park

(10) Patent No.: US 6,329,679 B1
(45) Date of Patent: Dec. 11, 2001

(54) PHOTODIODE WITH INCREASED PHOTOCOLLECTION AREA FOR IMAGE SENSOR

(75) Inventor: Sang Hoon Park, Ichon-shi (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/342,344

(22) Filed: Jun. 29, 1999

(30) Foreign Application Priority Data

Jun. 29, 1998 (KR) .................................................. 10-24649

(51) Int. Cl.[7] .................................................. H01L 31/062
(52) U.S. Cl. .......................... 257/292; 257/233; 257/594; 257/653; 257/586
(58) Field of Search .................................... 257/290, 291, 257/292, 233, 244, 594, 654, 653, 586; 438/343

(56) References Cited

U.S. PATENT DOCUMENTS

| | | | |
|---|---|---|---|
| 4,961,098 | * 10/1990 | Rosbeck et al. | 257/461 |
| 4,984,047 | 1/1991 | Stevens | 357/30 |
| 5,051,797 | 9/1991 | Stevens | 357/30 |
| 5,053,837 | * 10/1991 | Tonai | 257/292 |
| 5,831,312 | * 11/1998 | Wen | 257/594 |
| 5,841,159 | 11/1998 | Lee et al. | 257/291 |

FOREIGN PATENT DOCUMENTS

| | | | |
|---|---|---|---|
| 55-124278 | * | 9/1980 | (JP) . |
| 58-60568 | * | 4/1983 | (JP) . |
| 63168048 | | 7/1988 | (JP) . |

* cited by examiner

*Primary Examiner*—Minh Loan Tran
(74) *Attorney, Agent, or Firm*—Townsend and Townsend and Crew LLP

(57) ABSTRACT

The present invention relates to a pinned photodiode used in a CMOS image sensor. The pinned photodiode according to the present invention has an uneven surface for increasing an area of a PN junction of the photodiode. So, the increased PN junction area improves a light sensitivity of the photodiode. That is, the epitaxial layer, in which the photodiode is formed, has a trench or a protrusion. Also, in the pinned photodiode, since the $P^0$ diffusion layer is directly in contact with the P-epi layer, the two P-type layers have the same potential and then it may operate in a low voltage.

16 Claims, 7 Drawing Sheets

PHOTODIODE WITH INCREASED PHOTOCOLLECTION AREA FOR IMAGE SENSOR

FIELD OF THE INVENTION

The present invention relates to an image sensor; and, more particularly, to a photodiode of a CMOS (Complementary Metal Oxide Semiconductor) image sensor where the photodiode is called a pinned photodiode or a buried photodiode.

DESCRIPTION OF THE PRIOR ART

Generally, a CMOS image sensor is an apparatus to convert an optical image into electrical signals and employs MOS (Metal Oxide Semiconductor) transistors. A CCD (Charge Coupled Device) image sensor, as a kind of image sensor, has been widely known. As compared with the CCD image sensor, the CMOS image sensor may be easily driven with the various scanning schemes and integrated with a signal processing circuit on one-chip. Therefore, the CMOS image sensor may miniaturize its size and reduce the fabricating cost by using a compatible CMOS technology and lower the power consumption.

Referring to FIG. 1, a conventional unit pixel of a CMOS image sensor is composed of a pinned photodiode (PPD) and four NMOS transistors. The four NMOS transistors include a transfer transistor 102 for transferring photoelectric charges generated in a pinned photodiode to a sensing node, a reset transistor 104 for resetting the sensing node in order to sense a next signal, a drive transistor 106 for acting as a source follower and a select transistor 108 for outputting data to an output terminal in response to an address signal.

The reset transistor 104 and the transfer transistor 102 are made up of a native NMOS transistor so that the charge transfer efficiency is improved. The native NMOS transistor having a negative threshold voltage can prevent electron losses from being generated by a voltage drop due to a positive threshold voltage and then contribute the charge transfer efficiency to be improved.

Referring to FIG. 2, the conventional unit pixel of the CMOS image sensor includes a P$^+$ silicon substrate 201, a P-epi (epitaxial) layer 202, a P-well region 203, field oxide layers 204, a gate oxide layer 205, gate electrodes 206, an N$^-$ diffusion region 207, a diffusion region 208, an N$^+$ diffusion region 209 and oxide layer spacers 210. A pinned photodiode (PPD) has a PNP junction structure in which the P-epi 202, the N-diffusion region 207 and the P$^0$ diffusion region 208 are stacked. Such a pinned photodiode includes two ptype regions, each of which has the same potential so that the diffusion region 207 is fully depleted at a pinning voltage.

Since the transfer transistor having the transfer gate Tx is made up of a native transistor, an ion implantation process for adjusting transistor characteristics (threshold voltage and punch-through characteristics) may be omitted in the p-epi layer 202 which acts as a channel beneath a transfer gate Tx. Accordingly, the NMOS transistor (native transistor) having a negative threshold voltage may maximize the charge transfer efficiency. The N$^+$ diffusion region 209 (the sensing node) is made up of a highly doped N$^+$ region between the transfer gate Tx and the reset gate Rx, thereby amplifying a potential of the sensing node according to an amount of transferred charges.

Since a doping concentration of the P-epi layer 202 is lower than that of the p$^+$ silicon substrate 201, the p-epi layer 202 may increase a photosensitivity by increasing the depletion depth of the pinned photodiode. Also, the highly doped P$^+$ silicon substrate 201 beneath the P-epi layer 202 improves the sensor array modulation transfer function by reducing the random diffusion of the photoelectric charges. The random diffusion of charges in the P silicon substrate 201 leads to the possible "miscollection" of the photoelectric charges by neighboring pixels and directly results in a loss of image sharpness or a lower modulation transfer function. The shorter minority carrier lifetime and higher doping concentration of the P$^+$ silicon substrate 201 significantly reduces the "miscollection" of photoelectric charges since the charges are quickly recombined before diffusing to the neighboring pixels.

Since the pinned photodiode is formed on a predetermined region of the P-epi layer 202 between the field oxide layer 204 and the transfer gate Tx, it is impossible that the pinned photodiode may increase its unit area without reducing a integration degree. Also, the pinned photodiode may not increase its unit area beyond a design rule. When the design rule of the CMOS image sensor is less than 0.25 μm, the photosensitivity and resolution of the CMOS image sensor is reduced.

SUMMARY OF THE INVENTION

It is, therefore, an object of the present invention to provide a photodiode of an image sensor that may increase a unit area of the photodiode while maintaining a constant integration degree, thereby increasing the photosensitivity of the photodiode.

In accordance with an aspect of the present invention, there is provided a photodiode used in CMOS image sensor for sensing light from an object, the photodiode comprising: an uneven surface for increasing an area of a PN junction of the photodiode, whereby the increased PN junction area improves the light sensitivity of the photodiode, a semiconductor layer of a first conductivity type; at least one trench formed in the semiconductor layer to a predetermined depth; a first diffusion region of the first conductivity type formed in sidewalls of the trench and at bottom of the trench; and a second diffusion region of a second conductivity type formed beneath the first diffusion region, wherein a portion of the first diffusion region is directly in contact with the semiconductor layer.

In accordance with another aspect of the present invention, there is provided a photodiode used in CMOS image sensor for sensing light from an object, the photodiode comprising: an uneven surface for increasing an area of a PN junction of the photodiode, whereby the increased PN junction area improves the light sensitivity of the photodiode, a semiconductor layer of a first conductivity type; at least one protrusion protruded of a surface of the semiconductor layer; a first diffusion region of the first conductivity type formed beneath a surface of the protrusion; and a second diffusion region of a second conductivity type formed beneath the first diffusion region, extending to the surface of the semiconductor layer, wherein a portion of the first diffusion region is directly in contact with the semiconductor layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereafter, the present invention will be described in detail with reference to the accompanying drawings.

Figure 1:
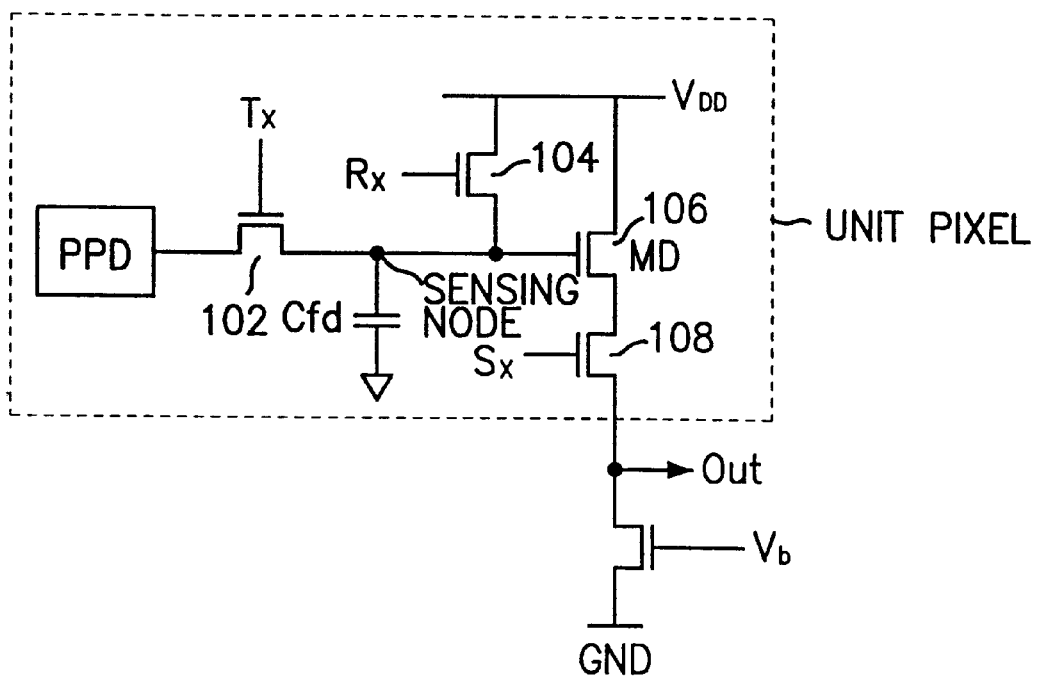
FIG. 1 is a circuit diagram illustrating a unit pixel of a conventional CMOS image sensor.
Figure 2:
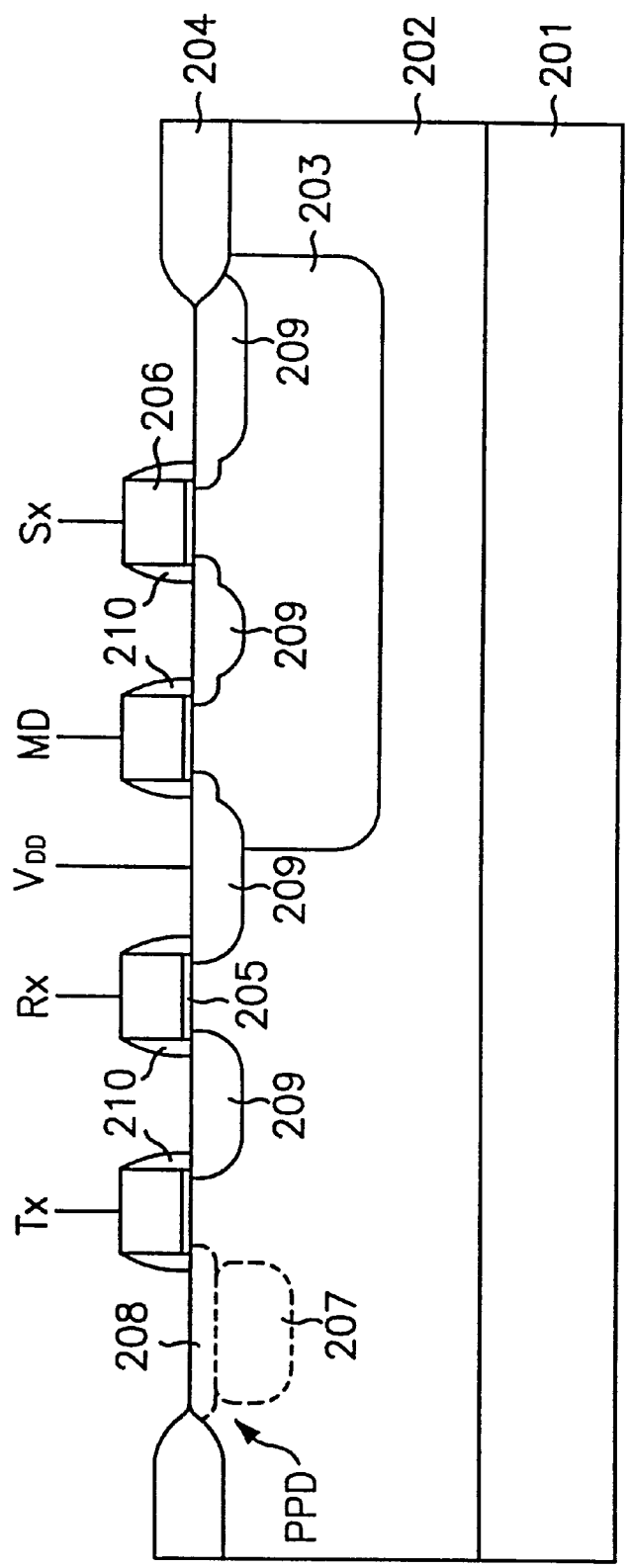
FIG. 2 is a cross-sectional view illustrating a structure of the unit pixel in FIG.1.
Figure 3A:
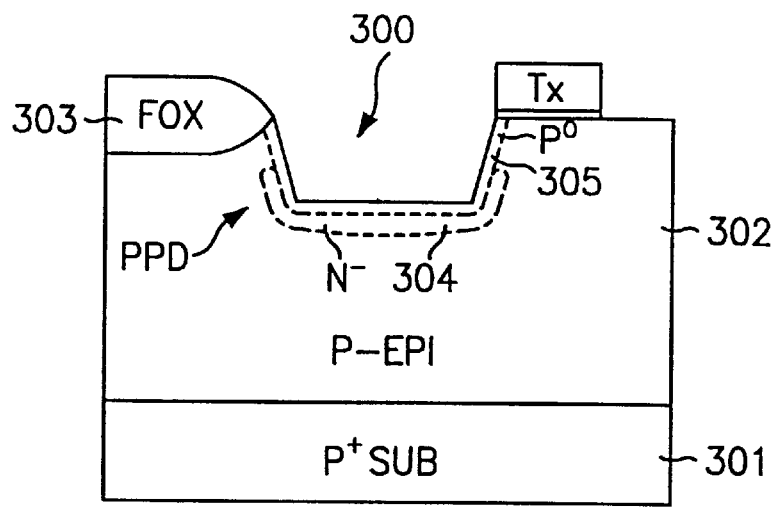
FIGS. 3A and 3B are cross-sectional views illustrating a structure of a pinned photodiode according to an embodiment of the present invention.
Figure 3B:
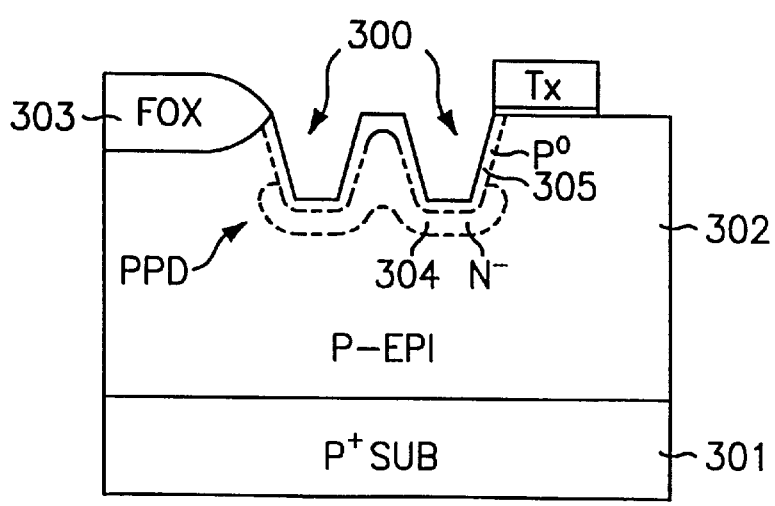

FIGS. 3A and 3B are cross-sectional views illustrating a structure of a pinned photodiode according to an embodiment of the present invention.

As shown in FIGS. 3A and 3B a trench 300 is formed in a P-epi layer 302 so that a unit area of the pinned photodiode is increased with maintaining a constant integration degree, thereby increasing the photosensitivity of the photodiode. The trench 300 is formed by etching to a predetermined thickness. A $P^0$ diffusion region 305 is formed in the P-epi layer 302 and beneath the surface of the exposed trench 300. An $N^-$ diffusion region 304 is formed in the P-epi layer 302 and at the bottom of the trench 300. In the preferred embodiment, the $N^-$ diffusion region 304 extends to the $P^0$ diffusion region 305. However, the ion implantation should be controlled so that the $N^-$ diffusion region 304 doesn't completely surround the $P^0$ diffusion region 305. That is, a portion of the P-epi diffusion region 305 should be directly in contact with the P-epi layer 302 in order that these two P-type regions 305 and 302 have the same potential. This direct contact leads to a low power operation below a power supply of 3.3V by fully depleting the $N^-$ diffusion region 304.

A PNP junction may be formed in the sidewall of the P-epi layer 302 of the trench 300 and beneath the lower portion of the P-epi layer 302 of the trench 300, so that the area of the PNP junction in the pinned photodiode is increased. Accordingly, the pinned photodiode of the present invention may increase the photosensitivity and resolution of the image sensor by increasing the area of the PNP junction.

The P-epi layer 302 has a thickness of approximately 5–10 μm and preferably the trench 300 has a depth of approximately 0.5–1.0 μm. The entrance (upper) portion of the trench 300 is wider than the lower portion of the trench 300. The sidewall of the trench 300 in the CMOS fabricating process is tapered by an angle of approximately 80–87 degrees so that the PNP junction is easily formed in the sidewall by the diffusion region.

FIGS. 4A to 4E are cross-sectional views illustrating a method for fabricating a unit pixel using CMOS processes.

Figure 4A:
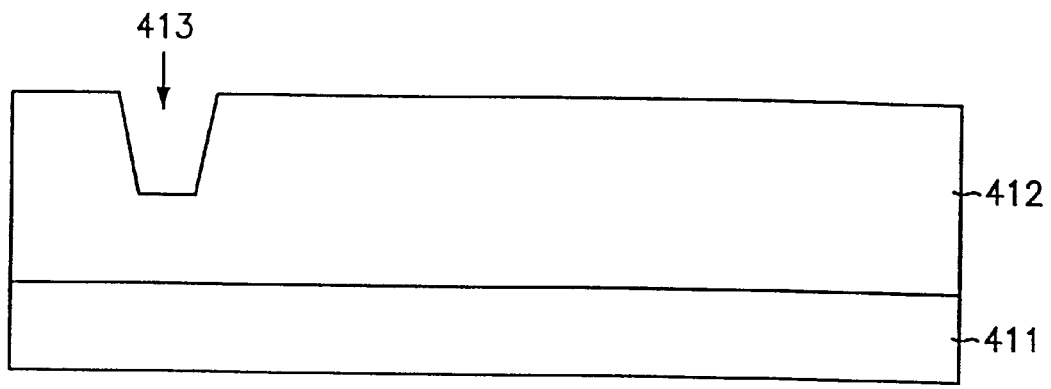
FIGS. 4A to 4E are cross-sectional views illustrating a method for fabricating the unit pixel using CMOS processes.

Referring to FIG. 4A, a P-epi layer 412 is grown on a $P^+$ silicon substrate 411 at a resistance of approximately 10–100 Ωcm. The epi layer 412 of a photo-sensing region to be the pinned photodiode is etched up to a predetermined thickness by a plasma etching process. A composite gas of $SF_6$ and $Cl_2$ is used in the plasma etching process so that an anisotropical etching process is applied to the P-epi layer 412, and a tapered trench 413 is formed. The tapered trench 413 has a depth of approximately 0.5–1.0 μm.

Figure 4B:
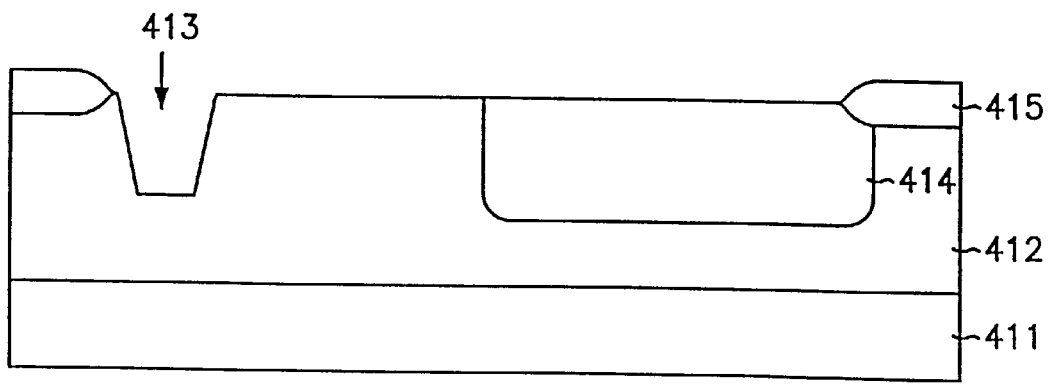

Referring to FIG. 4B, on conditions of energy of approximately 50–100 KeV and a concentration of 7E12–9E12/$cm^2$, a P-well 414 is formed within the P-epi layer 412 by a boron ion implantation and then a field oxide layer 415 is formed.

Figure 4C:
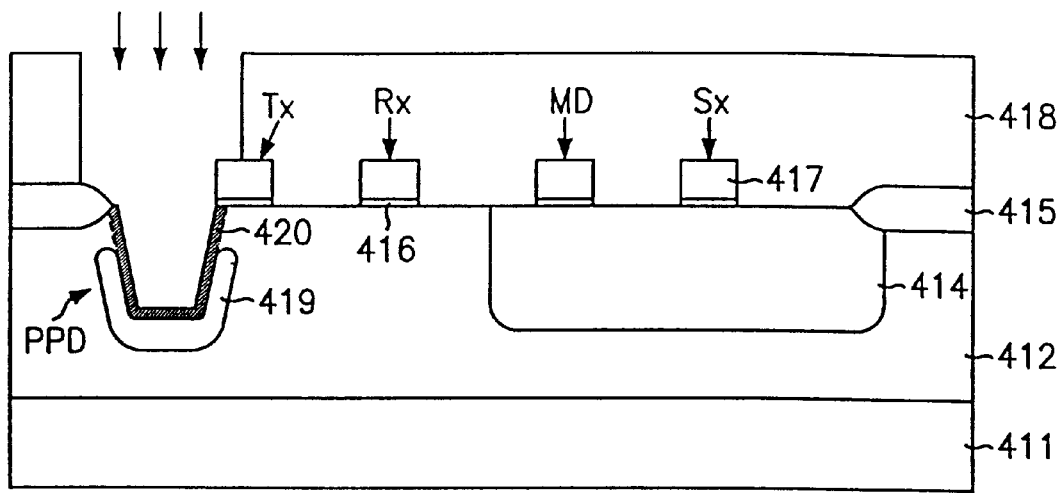

Referring to FIG. 4C, gate oxide layers 416 and gate electrodes 417 are, in this order, formed on the P-epi layer 412. A transfer gate Tx and a reset gate Rx among the gate electrodes 417 are patterned so that they have channel lengths of more than approximately 1 μm. Also, a drive gate MD and a select gate Sx among the gate electrodes 417 are patterned so that they have channel lengths less than approximately 0.5 μm.

A mask 418 is formed so that the P-epi layer 412 of the trench 413 is exposed. A $P^0$ diffusion region 420 and an $N^-$ diffusion region 419, respectively, are formed by ion implantation processes. Then, on conditions of energy of approximately 150–250 KeV and a concentration of 1E12–3E12/$cm^2$, the diffusion region 419 is formed by a phosphor ion implantation. Also, on conditions of energy of approximately 20–40 KeV and a concentration of 1E13–3E13/$cm^2$, the $P^0$ diffusion region 420 is formed by a $BF_2$ ion implantation. Accordingly, the pinned photodiode having the PNP junction structure is formed. At this time, an edge of the mask 418 is disposed on a field oxide layer 415 and another edge thereof is disposed on the gate of the transfer transistor Tx. It should be noted that the acceleration energy of phosphor ions is higher than that of the $BF_2$ ions in order that the $P^0$ diffusion region 420 be directly in contact with the P-epi layer 412.

Figure 4D:
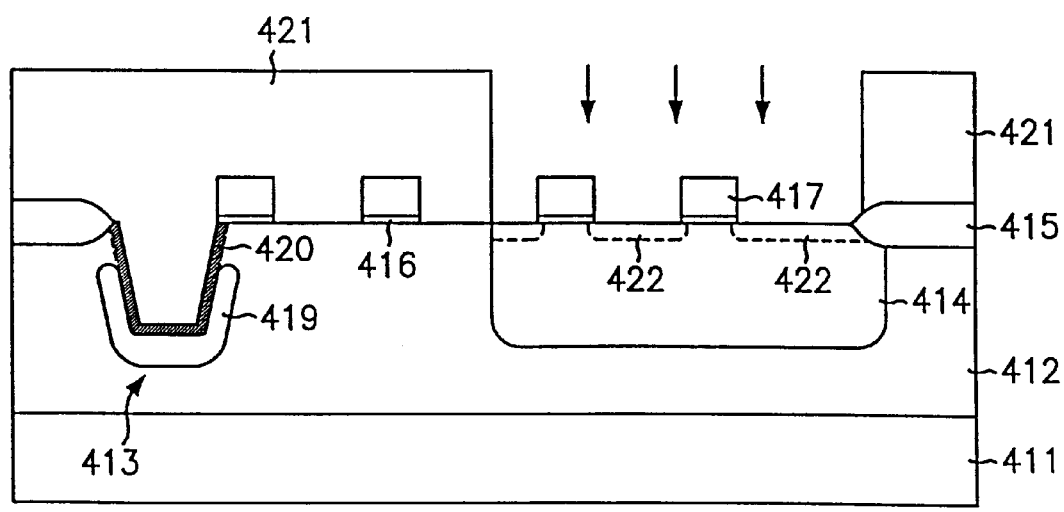

Referring to FIG. 4D, after removing the mask 418, a mask 421, in which the P-well 414 is opened, is formed. Then, on conditions of energy of approximately 20–60 KeV and a concentration of 3E12–5E12/$cm^2$, the lightly doped region 422, for adjusting threshold voltage, is formed by a phosphor ion implantation.

Figure 4E:
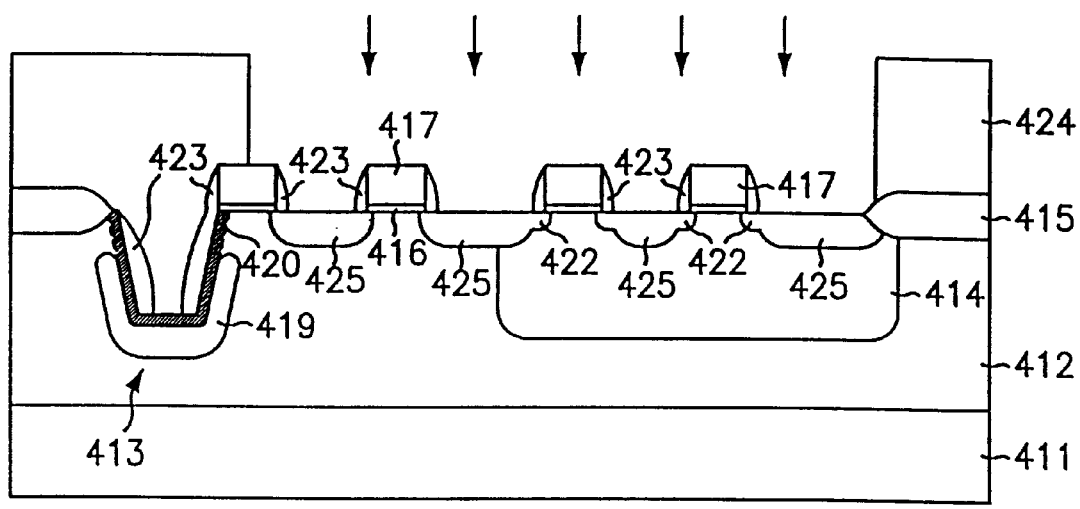

Referring to FIG. 4E, the mask 421 is removed and a TEOS (Tetraethoxysilane) oxide layer of approximately 2,000–2,500 Å is formed on the resulting structure by the LPCVD (Low Pressure Chemical Vapor Deposition) process. Then, an anisotropical plasma etching process is carried out on the TEOS oxide layer. Accordingly, spacers 423 are formed on exposed gate electrodes 417 and the sidewall of the trench 413. A mask 424, which covers the photo-sensing region (pinned photodiode) is formed and then, on conditions of energy of approximately 60–90 KeV and a concentration of 1E15–9E15/$cm^2$, an $N^-$ diffusion region 425 is formed by an As ion implantation.

Figure 5A:
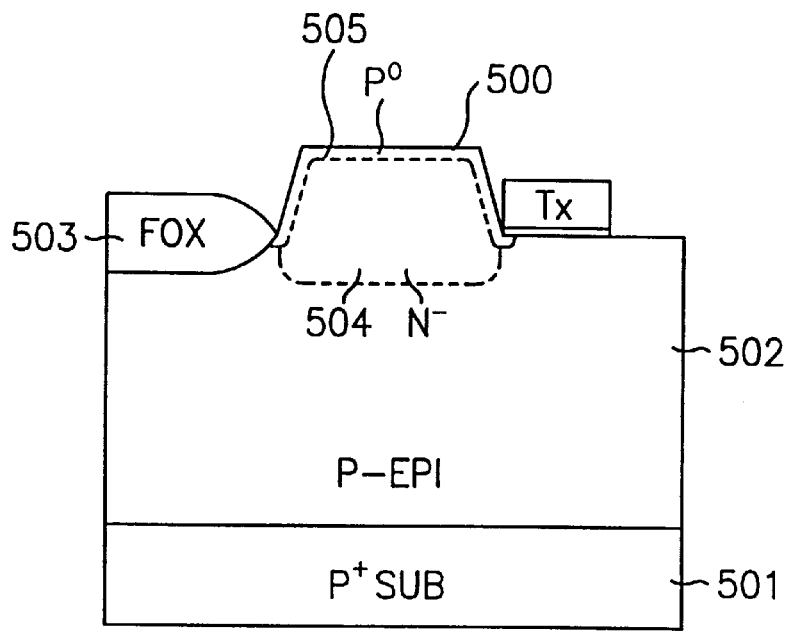
FIGS. 5A and 5B are cross-sectional views illustrating a structure of a pinned photodiode according to another embodiment of the present invention.
Figure 5B:
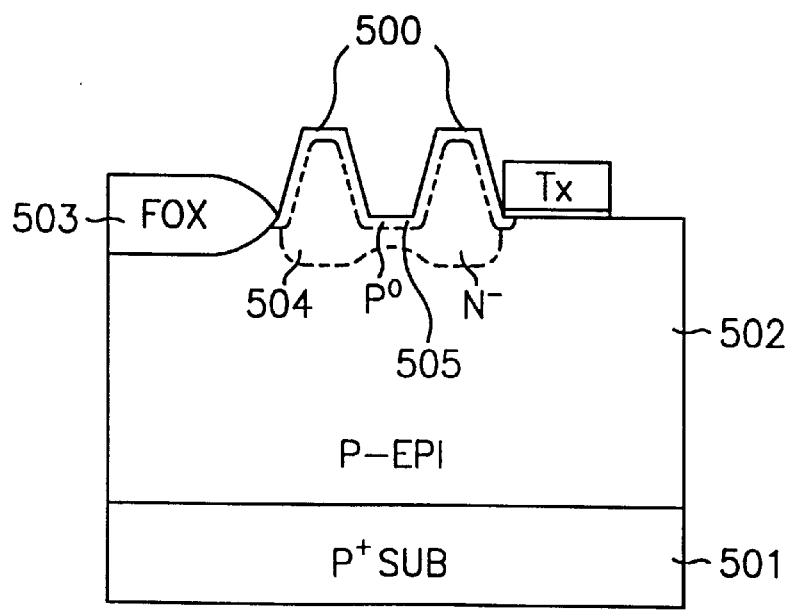

FIGS. 5A and 5B are cross-sectional views illustrating a structure of a pinned photodiode according to another embodiment of the present invention.

As shown in FIGS. 5A and 5B a protrusion 500 is formed on the surface of a P-epi layer 502 so that a unit area of the pinned photodiode is increased with maintaining a constant integration degree, thereby increasing the photosensitivity of the photodiode. A $P^0$ diffusion region 505 is formed in the P-epi layer 502 and beneath the surface of the exposed protrusion 500. An $N^-$ diffusion region 504 is formed in the P-epi layer 502 and beneath the $P^0$ diffusion region 505. In the preferred embodiment, the $N^-$ diffusion region 504 extends to the P-epi layer 502. A portion of the $P^0$ diffusion region 505 is directly in contact with the P-epi layer 502 in order that these two P-type regions 505 and 502 have the same potential. Similar to FIGS. 3A and 3B, this direct contact leads to a low power operation below a power supply of 3.3V by fully depleting the $N^-$ diffusion region 504.

A PNP junction may be formed in the sidewall of the P-epi layer 502 of the protrusion 500 and beneath the lower portion of the P-epi layer 502 of the protrusion 500, so that the area of the PNP junction in the pinned photodiode is increased. Accordingly, the pinned photodiode of the present invention may increase the photosensitivity and resolution of the image sensor by increasing the area of the PNP junction.

The P-epi layer 502 has a thickness of approximately 5–10 μm and preferably the protrusion 500 has a depth of approximately 0.5–1.0 μm. The upper portion of the protrusion 500 is narrower than the lower portion of the protrusion 500. The sidewall of the protrusion 500 in the CMOS fabricating process is tapered by an angle of approximately 80–87 degrees so that the PNP junction is easily formed in the sidewall by the diffusion region.

The CMOS fabricating process described above may be implemented in various ways. For example when the P-epi layer 502 is partially etched, the protrusion 500 may be formed. Or, alternatively the protrusion 500 may be formed on the existing P-epi layer 502 by an epitaxial growth.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photodiode for sensing light from an object, comprising:
    at least one trench formed in a semiconductor layer of a first conductivity type, the at least on trench having sidewalls and a substantially flat bottom;
    a first diffusion region of a second conductivity type formed beneath the bottom of the trench and along the sidewalls to form a PN junction with the semiconductor layer; and
    a second diffusion region of the first conductivity type formed between the first diffusion region, along the trench sidewalls and underneath the bottom of the at least one trench, wherein a portion of the second diffusion region is directly in contact with the semiconductor layer.

2. The photodiode as recited in claim 1, wherein the at least one trench is tapered so that an upper portion of the at least one trench is wider than a lower portion thereof.

3. The photodiode as recited in claim 2, further comprising: a semiconductor substrate having a doping concentration of the first conductivity type, the semiconductor layer being formed on the substrate and the substrate having a higher doping concentration than a doping concentration of the semiconductor layer.

4. The photodiode as recited in claim 3, wherein the semiconductor layer is an epitaxial layer, which is grown on the semiconductor substrate to a thickness of approximately 5–10 μm.

5. The photodiode as recited in claim 2, wherein the at least one trench has a depth of approximately 0.5–1.0 μm.

6. A unit pixel circuit for use in a CMOS image sensor, the pixel comprising:
    a transfer transistor having a gate, a drain and a source, the transfer transistor gate controlled by a transfer signal, the transfer transistor drain coupled to a sense node and the transfer transistor source coupled to the photodiode as set forth in claim 1;
    a reset transistor having a gate, a drain and a source, the reset transistor gate controlled by a reset signal, the reset transistor drain coupled to a power supply and the reset transistor source coupled to the sense node;
    a drive transistor having a gate, a drain and a source, the drive transistor gate coupled to the sense node and the drive transistor drain coupled to the power supply; and
    a select transistor having a gate, a drain and a source, the select transistor gate controlled by a select signal, the select transistor drain coupled to the drive transistor source and the select transistor source providing an output for the pixel.

7. A photodiode for sensing light from an object, the photodiode comprising:
    a semiconductor layer of a first conductivity type;
    at least one protrusion protruded from a surface of the semiconductor layer;
    a first diffusion region of the first conductivity type formed beneath a surface of the at least one protrusion; and
    a second diffusion region of a second conductivity type formed beneath the first diffusion region, wherein a portion of the first diffusion region is directly in contact with the semiconductor layer.

8. The photodiode as recited in claim 7, wherein the at least one protrusion is tapered so that an upper portion of the at least one protrusion is narrower than a lower portion thereof.

9. The photodiode as recited in claim 8, further comprising: a semiconductor substrate of the first conductivity type, the semiconductor layer being formed on the substrate and having a doping concentration that is less than a doping concentration of the semiconductor substrate.

10. The photodiode as recited in claim 9, wherein the at least one protrusion has a depth of approximately 0.5–1 μm.

11. A photodiode, comprising:
    at least one trench formed in a semiconductor layer of a first conductivity type;
    a first region of the first conductivity type formed beneath a surface of the at least on trench; and
    a second region of a second conductivity type, opposite that of the first conductivity type, formed beneath and adjacent the first region,
    wherein a portion of the first region is in contact with the semiconductor layer.

12. The photodiode of claim 11, wherein the surface of the at least one trench is defined by sidewalls and a bottom and the second region extends partially up a length of the sidewalls from beneath and adjacent the first region.

13. The photodiode of claim 11, wherein the at least one trench has a depth of in the range of approximately 0.5 to 1.0 μm.

14. A photodiode for sensing light from an object, comprising:
    at least one trench formed in a semiconductor layer of a first conductivity type;
    a first region of the first conductivity type formed along the trench sidewalls and underneath the bottom of the at least one trench; and
    a second region of a second conductivity type, opposite that of the first conductivity type, formed beneath and adjacent the first region,
    wherein the at least one trench has a depth of approximately 0.5–1.0 μm and a portion of the first region is in contact with the semiconductor layer.

15. The photodiode of claim 14, wherein the surface of the at least one trench is defined by sidewalls and a bottom and the second region extends partially up a length of the sidewalls from beneath and adjacent the first region.

16. The photodiode of claim 14, wherein the at least one trench is tapered so that an upper portion of the at least one trench is wider than a lower portion thereof.

* * * * *